United States Patent [19]

Sapsford

[11] Patent Number: 5,062,687.

[45] Date of Patent: Nov. 5, 1991

[54] CARBON COATING OF OPTICAL FIBRES

[75] Inventor: Gary S. Sapsford, Bishop's Stortford, Great Britain

[73] Assignee: STC PLC, London, England

[21] Appl. No.: 531,859

[22] Filed: May 31, 1990

[30] Foreign Application Priority Data

May 31, 1989 [GB] United Kingdom ............... 8912470

[51] Int. Cl.⁵ .............................................. G02B 6/16
[52] U.S. Cl. .................................. 350/96.30; 65/3.11; 350/96.34; 427/163
[58] Field of Search .......................... 350/96.29-96.34; 427/162, 163, 164, 165; 65/2, 3.11, 3.12, 3.1

[56] References Cited

U.S. PATENT DOCUMENTS

| 4,183,621 | 1/1980 | Kao et al. ........................... 350/96.30 |
| 4,512,262 | 4/1985 | Hanson et al. ..................... 350/96.30 |
| 4,575,463 | 3/1986 | Biswas et al. ...................... 427/163 |
| 4,735,856 | 4/1988 | Schultz et al. ............... 350/96.29 X |

FOREIGN PATENT DOCUMENTS

| 0154482A | 9/1985 | European Pat. Off. . |
| 0238085A | 9/1987 | European Pat. Off. . |
| 0308143A | 3/1989 | European Pat. Off. . |
| 0353934A | 2/1990 | European Pat. Off. . |
| 1134133 | 11/1968 | United Kingdom . |
| 2012066A | 7/1979 | United Kingdom . |
| 2105371A | 3/1983 | United Kingdom . |
| 2128637A | 5/1984 | United Kingdom . |
| 2156858A | 10/1985 | United Kingdom . |

Primary Examiner—John D. Lee
Attorney, Agent, or Firm—Lee, Mann, Smith, McWilliams & Sweeney

[57] ABSTRACT

An optical fiber is provided with a vitreous carbon coating by the pyrolysis of propadiene promoted by the retained heat of the fiber immediately after it has been drawn from preform.

7 Claims, 1 Drawing Sheet

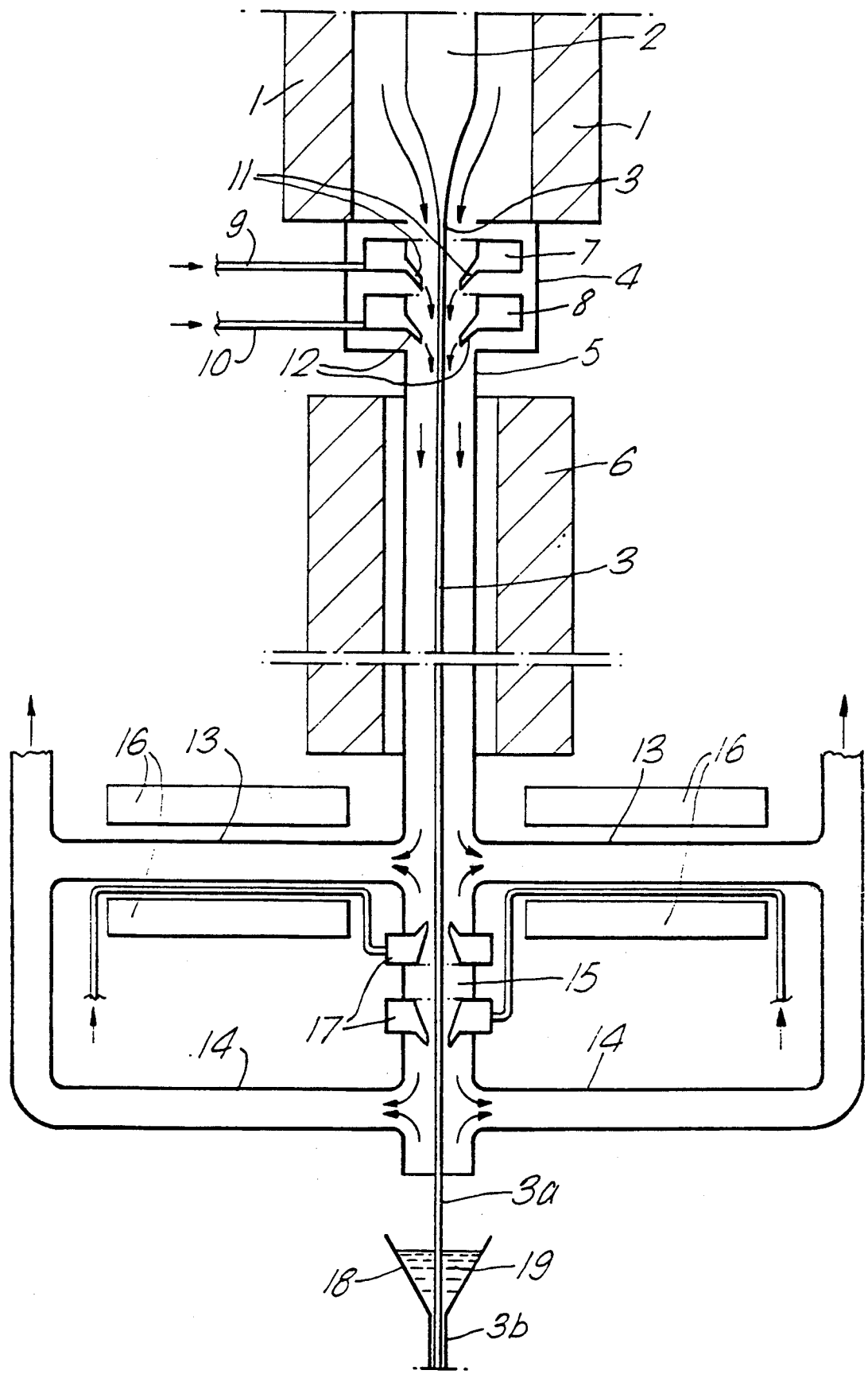

– 5,062,687 –

CARBON COATING OF OPTICAL FIBRES

BACKGROUND OF THE INVENTION

This invention relates to the provision of coatings on the surface of glass fibres, particularly, though not necessarily exclusively, on the surface of freshly drawn optical fibre that has been prepared by a method involving the vapour deposition of silica.

It is well known that the initial tensile strength of freshly drawn silica optical fibre deteriorates very significantly if the surface of the fibre is not almost immediately protected. For this reason much silica optical fibre is provided with a plastics protective coating using coating apparatus that is located immediately beneath the fibre drawing apparatus and is operated on-line with the drawing operation. For many applications the protection provided for the pristine glass surface of the fibre by a plastics protective coating provided in this way is satisfactory. For some applications, however, it is not. Typically this is because plastics coatings are found insufficiently impermeable to water, and the presence of water at the glass fibre surface is particularly liable to promote a reduction in tensile strength through the agency of stress-corrosion. Additionally it may be found that plastics protective coatings provide inadequate resistance to permeation by hydrogen. For many applications a barrier to penetration by hydrogen is useful primarily because of the relatively strong optical absorption bands present at inconvenient regions of the optical spectrum that are associated with the presence of hydrogen.

In U.S. Pat. No. 4,183,621, to which attention is directed, there is described a construction of coated optical fibre in which the glass surface of a silica optical fibre is provided with a carbon barrier layer impervious to moisture. Methods of coating that are suggested comprise passing the fibre through a colloidal suspension of carbon particles and then heating the deposited carbon, plasma coating, chemical vapour deposition, vacuum evaporation, and pyrolysis in a reducing or inert atmosphere of a hydrocarbon such as methane.

U.S. Pat. No. 4,575,463 also relates to the provision of hermetic coatings on optical fibres, and is particularly concerned with the provision of heterogeneously nucleated chemical vapour deposition coatings where the deposition reaction is initiated at the surface of the fibre as the result of its high temperature. This high temperature may be provided by locating the coating deposition chamber relatively close beneath the fibre drawing furnace so that the fibre is caused to enter the deposition chamber very shortly after it has left the drawing furnace. However, as observed in European Patent Specification No. 0,308,143 A, U.S. Pat. No. 4,575,463 does not specifically mention the deposition of hermetic coatings made of carbon. EP 0,308,143 A states that a number of different hydrocarbons can be used in a heterogeneously nucleated chemical vapour deposition reaction to produce a carbon coating upon an optical fibre, particularly exemplifying the use of acetylene for this purpose.

It is highly desirable that such a carbon layer is appled to freshly drawn fibre before it touches any solid surface since contact with such surfaces is liable to impair fibre strength. If the fibre is not to touch any solid surface prior to being coated, the coating of the fibre freshly drawn from fibre preform must take place in the space existing between the bottom of the drawing zone and the first place that the fibre changes direction, either as the result of becoming wound upon the surface of a take-up drum, or as the result of being deflected round some form of guide pulley. Part of this space may also be required for the application and curing of a plastics protective coating for the fibre. The available space for coating with carbon is thus typically strictly limited, and this in turn means that coating efficiency is a critical parameter if a sufficient depth of impermeable carbon is to be deposited in the space available. In this context it is to be noted that the dwell time of any stretch of fibre within the space available for coating is reduced as the drawing speed is increased. Thus, in the provision of an impervious carbon coating, a problem is liable to be encountered in achieving a sufficient depth of coating within the time and space permitted. Surprisingly it was found that the rate of deposition, and hence the thickness of coating provided by a particular set of deposition conditions depended to a marked extent upon the hydrocarbon chosen as the source material of the carbon coating. In a particular instance, using a drawing speed of 20 metres per minute, a coating thickness of less than 1.6 nm was achieved using methane in a reactor 600 mm long. This is to be contrasted with the obtaining of a coating thickness of 108 nm when a particular hydrocarbon was substituted for the methane without changing any of the other deposition conditions.

SUMMARY OF THE INVENTION

It is a primary object of the present invention to provide a high deposition rate method of depositing a carbon coating upon an optical fibre in a manner producing an hermetically coated fibre of acceptable hermeticity and strength.

According to the present invention there is provided a method of providing a glass fibre with a vitreous carbon coating which coating is formed at least principally by the pyrolysis of propadiene.

The preferred form of deposition process is heterogeneous nucleated chemical vapour deposition (HNCVD) process initiated by passing heated fibre through the deposition chamber. The coating is preferably applied to freshly prepared fibre immediately after it has been drawn from larger diameter preform. In such circumstances it is generally convenient to locate the deposition chamber close under the drawing furnace so that HNCVD is initiated by the retained heat from the drawing furnace, thus obviating the need to provide auxiliary heating. One feature of this use of the heat of the drawing furnace is that, with a given length of deposition chamber, the thickness of deposit tends to increase with increasing fibre drawing speed because the fibre is carried deeper into the chamber before it has had time to cool to the temperature at which deposition effectively ceases. A general feature of the use of HNCVD to produce vitreous carbon coatings on silica fibres is that the deposit has a radially graded structure, with the innermost portion of the deposit occurring at the highest temperature, and succeeding portions deposited at progressively lower temperatures. As a result of mismatch in thermal expansion coefficients between the vitreous carbon and the underlying silica, the carbon is likely to acquire a level of tension in the plane of the carbon coating that is determined essentially by the deposition temperature. The value of this 'intrinsic' stress limits the degree of additional externally applied stress which is tolerable, and also defines the rate at which any stress-corrosion phenomena may proceed at the coating's own surface. Under these circumstances therefore the radial grading may be perceived as advantageous because the stress in the coating is thereby expected to decrease in magnitude through the thickness of the coating from inside surface to outside surface.

BRIEF DESCRIPTION OF THE DRAWINGS

There follows a description of an experimental apparatus employed for providing a vitreous carbon coating on silica optical fibre on-line with its being drawn from a preform as that preform is progressively lowered into a fibre-drawing furnace. This is followed by comparative details of results produced with different deposition reagents and conditions. The description refers to the accompanying drawing and tables in which:

FIG. 1 is a schematic diagram of the coating apparatus,

Table 1 is a table providing a comparison of deposition efficiency using different chemical reagents, Table 2 is a table characterising results obtained with different coating conditions, and Table 3 contrasts results obtained using acetylene with those using propadiene.

DETAILED DESCRIPTION OF PREFERRED EMBODIMENT

Referring to FIG. 1, the experimental vitreous carbon coating apparatus is fitted directly to the base of a conventional silica optical fibre drawing furnace 1. In this drawing furnace the bottom end of an optical fibre preform 2 is drain into fibre 3 as that preform is progressively lowered into the furnace. At the bottom end of the drawing furnace 1 the fibre issues directly through an HNCVD reagent delivery system 4 into a reactor tube 5 which is surrounded by a tube furnace 6. The reactor tube is 600 mm long and its internal diameter is 22 mm.

The reagent delivery system 4 has a tandem arrangement of two annular chambers 7 and 8 with individual delivery tubes 9 and 10 and annular outlet orifices 11 and 12 surrounding the fibre 3. Two chambers have been provided in this apparatus in order to afford the facility of independent control over the simultaneous admission of two different reagents to the reactor tube. The use of different reagents may find use in the formation of a coating having an outer part of slightly different structure from that of an inner part which is in direct contact with the underlying glass. For many applications however only one reagent is required, in which case only one of the chambers is employed.

At the lower end of the reactor tube 5 is located a tandem arrangement of first and second stage exhaust manifolds 13 and 14 with an intervening non-contacting seal 15. The fibre 3 emerging from the second stage exhaust manifold passes through an on-line polymer-coating and curing stage (curing stage not shown), and from there is taken up on a drum (not shown) where rotation rate controls the fibre drawing speed. Any unspent reagent exhausted by the first exhaust manifold is pyrolysed in the passage of the exhaust through furnaces 16 before the exhaust gases are mixed with those from the second exhaust manifold and directed to an extractor (not shown). The non-contacting seal 15 is of the type described in GB 2,159,812 A comprising a pair of air movers 16, 17 connected back-to-back. This seal enables the now vitreous carbon coated fibre 3a to pass out of the vitreous carbon coating apparatus without physical contact with any surfaces, whilst simultaneously containing the coating reagent and excluding air. Optionally the fibre 3a may be immediately provided with a plastics protective coating, for instance by passing it through a coating cone 18 containing plastics resin 19. The resin coated fibre 3b emerging from the cone 19 is then cured by means not shown in this Figure.

Since heterogeneous deposition is desired, the reactor furnace temperature needs to be kept beneath that at which the corresponding homogeneous gas phase reaction proceeds at a significant rate. On the other hand the temperature of the reagents in the reactor tube should be kept as high as possible in order to minimise the energy that needs to be extracted from the hot fibre to promote the required heterogeneous deposition.

Reactor furnace temperature is not the only parameter to affect the thickness of the vitreous carbon deposited upon the fibre in its passage through the reactor tube 5. Clearly the initial temperature of the fibre on entry into the tube is important and also the fibre size. All results quoted below are in respect of fibre drawn to a diameter of $125+2$ $\mu$m. The temperature of the fibre on entry into the reactor tube 5 is found to depend in part upon the fibre drawing speed, and in part upon the rate of flow at which the argon purge through the drawing furnace is set. Clearly, the faster the fibre drawing speed, the closer the temperature of the fibre on entry into the reactor tube approaches the peak temperature of the drawing furnace. The argon purge of the drawing furnace affects the temperature because it is exhausted via the reactor tube. At normal purge rates an increase in flow rate will increase the heat transfer from the drawing furnace to the reactor tube, and hence be associated with an increase in the temperature of the fibre on entry into the reactor tube. In principle the purge rate could be increased to the point at which it is so fast that it fails to pick up enough heat in its passage through the drawing furnace, in which case a further increase purge rate would produce a reduction in fibre entry temperature.

The drawing speed is also an important factor in determining the thickness of the vitreous carbon deposited upon the fibre in the passage through the reactor tube 5. A feature of using relatively high line speeds is that there is not too significant a drop in temperature of the fibre between its leaving the drawing furnace and its entering the reactor tube, even when the top of the reactor tube is spaced a small distance from the bottom of the drawing furnace. Under these conditions it is possible to modify the apparatus of FIG. 1 so that at least the majority of the argon purge is extracted from a tube (not shown) extending between the drawing furnace and the reactor tube so that the argon purge does not act as a significant diluent of the reacting gas in the reactor tube. Additionally, an increase in drawing speed lengthens the distance that any portion of the fibre penetrates into the reactor tube before it has cooled to the point at which it is no longer hot enough to initiate any further heterogeneous deposition. In general, this greater distance means that the fibre is exposed to more reagent within the reactor tube, and hence a greater thickness of deposit results.

In addition to the foregoing factors, we have found that the choice of reagent gas has a marked effect upon deposition rate. Table 1 depicts the results of a comparative analysis of deposition rate resulting from the use of various different hydrocarbons having no more than four carbon atoms per molecule. The table lists coating thicknesses obtained with two different rates of reagent flow, 3.5 litres per minute and 8.0 litres per minute. In the case of acetylene the reagent flow rate was only 2 litres per minute. The coatings were formed on 125 μm diameter fibre drawn from the preform at the rate of 20m/min. The rate of argon purge through the drawing furnace was set at 4.6 litres per minute and the temperature of the furnace surrounding the reactor tube 5 was maintained at 800° C. The coating thickness was computed from a measure of the electrical resistance per unit length of the coating fibre, based on the assumption that the resistivity of the carbon coating has a resistivity of $1.2 \times 10^{-5} \Omega m$. This value of resistivity was in its turn arrived at as the average value computed from Auger analysis and scanning electric microscope measurements of coating thickness of sample lengths of coated fibre and corresponding measurements of resistance per unit length. (The equipment employed for measuring resistance per unit length of the coating was capable of providing measurements up to a value of about 2MΩ per metre, corresponding to a coating thickness down to about 1.6nm). The table shows a significant increase in coating efficiency, when using the lower reagent flow rate, in the case of iso-butane, 1-butane, iso-butene, acetylene and propadiene. The coating efficiency, larger in the case of the unsaturated members of the group, is particularly large in the case of the examples with two unsaturated carbon-to-carbon bonds, namely in the case of acetylene and propadiene, with the coating efficiency resulting from the use of propadiene being very significantly greater than that resulting from the use of acetylene. With one exception, in every instance in which the coating depth obtained with the higher reagent flow rate was greater than the minimum measurement limit of 1.6nm, the use of the higher reagent flow rate was found to be associated with an increased depth of deposition. The reason for the anomalous effect observed with the use of 1-butene is not fully understood, but, it is believed, may be associated with the increased degree of quenching provided by the greater flow rate of the cool reagent gas flow.

Table 1 provides for two particular sets of deposition conditions a comparison of coating thicknesses produced with different reagents. It being by no means certain that either set of deposition conditions was anywhere near ideal for coating efficiency and coating efficacy, a further set of comparative tests was made in respect of propadiene to investigate this matter. Some results of these comparative tests are set out in Table 2.

The conditions of example 1 of the Table 2 are the same as those quoted for the 3.5 litres per minute flow rate example of the table of Table 1. The progression from example 1 Table 2 through to example 6 shows a marked increase in coating efficiency in terms of quantity of carbon deposited upon the fibre to quantity of propadiene used.

Table 1 appears to indicate that the next best reagent after propadiene is likely to be acetylene, but the examples of Table 1 do not provide a direct comparison between these two materials because, under the particular conditions pertaining in the HNCVD coating apparatus employed it was not possible to increase the acetylene flow rate as high as the 3.5 litres per minute flow rate used in respect of the other reagents without giving rise to combustion of excess acetylene in the vicinity of the point of emergence of the coated film from the coating apparatus.

The results quoted in Table 3 were obtained using alternative apparatus, and do provide a direct comparison, showing an approximately fourfold improvement in coating efficiency when making the change from acetylene to propadiene. This alternative HNCVD apparatus was located 70 cm beneath the fibre drawing zone, where the fibre drawing furnace temperature was stabilised at 2275° C. and from which fibre was drawn at the rate of 240 m/min. In the HNCVD reactor tube the flow of reagent gas was supplemented with diluent flow of argon at the rate of 2 litres per minute.

For some applications a primary reason for applying a vitreous carbon coating to an optical fibre is in order to provide it with an enhanced resistance to stress corrosion. The stress corrosion susceptability factor 'N' of an optical fibre can be evaluated by conducting a number of dynamic tensile tests to failure over a range of strain rates. Fibres that are relatively prone to stress corrosion exhibit an average failure strain that decreases markedly with decreasing strain rate, whereas the failure strain of fibres that almost independent of strain rate. An estimate for 'N, can be obtained by measuring the gradient of the curve produced by plotting the log of the average failure strain as a function of the log of the strain rate, and equating this value to $1/(N+1)$. 'N' is thus essentially an inverse measure of the extent to which the failure strain (strength) of a fibre varies as a function of the strain rate. Accordingly high values of N are desirable in this context.

To investigate the measure of stress corrosion protection afforded by the vitreous carbon coating produced from propadiene under the conditions set out in example 3 of Table 2, a length of 125 μm diameter optical fibre coated in this manner was fed from the carbon coating apparatus direct into an open-cup coating cone where it was coated with an on-line ultraviolet-light curing acrylate coating to an overall diameter of 250 um. Dynamic tensile tests over five decades of strain rate were performed on 0.5 metres samples taken from the length of fibre. From measures on the average of the samples at each strain rate, a computed value of $N = 695$ was obtained for the stress corrosion susceptability factor for the vitreous carbon coated fibre. By way of contrast, equivalent tests performed on similar samples taken from a length of substantially similar fibre, differing from the foregoing only inasmuch as it possessed no vitreous carbon coating underlying the acrylate, exhibited a stress corrosion susceptability factor of $N = 30$.

For some applications a primary reason for applying a vitreous carbon coating to an optical fibre is not so much for its stress-corrosion protection properties, but for its use as a barrier to hydrogen diffusion. Tests to investigate this feature were performed on 1 km samples of acrylate coated fibre wound on glass bobbins and subjected to an environment of 10 atmospheres pressure of pure hydrogen at 150° C. for protracted periods of time. These conditions serve to provide an 'accelerated' simulation of the result of the ingress of hydrogen, and the technique is well-known and widely used in the field of optical fibres testing. The elevated temperature serves to increase the rate of hydrogen diffusion, while the high pressure serves to increase the saturation level of hydrogen concentration to which the fibre structure will eventually proceed.

An indication of the presence and concentration of molecular hydrogen which may have diffused into the light guiding structure of an optical fibre is provided by measuring the optical attenuation of the fibre over a suitable range of the spectrum in which the presence and height of absorption peaks characteristic of molecular hydrogen can be inspected. Molecular hydrogen is known to produce absorption peaks at about 1244 nm and about 1690 nm, and the height of the use two peaks above the spectral base-line provides a measure of the concentration of molecular hydrogen. Using these measurements, it is then possible to calculate the performance of the fibre under the ambient service environment of interest.

Comparative spectral absorption tests were made in respect of four lkm lengths of optical fibre subjected to the previously mentioned 'accelerated' hydrogen diffusion regime of 10 atmospheres of hydrogen at 150° C. The first three lengths were 125 μm diameter fibres with vitreous carbon coatings respectively as described with reference to examples 2, 3 and 4 of Table 2, and with on-line UV-cured acrylate coatings to an overall diameter of 250 um. The fourth fibre, provided for comparison purposes, was a length of substantially identical 125 um diameter fibre, complete with substantially identical acrylate coating to an overall diameter of 250 μm, but with no vitreous carbon between the glass of the fibre and its acrylate coating.

In all three examples of the vitreous carbon coated fibre, the two peaks characteristic of molecular hydrogen were not noticeable above the spectral base-line even after exposure periods ranging from 400 hours up to 2900 hours. By way of contrast, in the case of the example of fibre without any vitreous carbon coating, a measurement of the absorption peak at 1244 nm after 130 hours exposure provided a value of 23 dB/km above baseline. In this particular set of tests no measurements were made before 130 hours, but in other measurements on similar fibre without any vitreous carbon coating underlying the acrylate, spectral measurements indicate saturation with molecular hydrogen to have typically occurred in less than 10 hours of exposure.

TABLE 1

| Reagent | Coating depth in namometers at flow rate of 3.5 liters per minute | Coating depth in namometers at flow rate of 8.0 liters per minute |
| --- | --- | --- |
| Methane | 1.6 | 1.6 |
| Ethane | 1.6 | 1.6 |
| Propane | 1.6 | 4.0 |
| n-Butane | 1.6 | 3.7 |
| iso-Butane | 3.5 | 7.6 |
| Industrial Butane (⅔ 'n', ⅓ 'iso') | 3.8 | — |
| 1-Butene | 19 | 3.5 |
| iso-Butene | 15 | 34 |
| Acetylene | 27* | — |
| Propadiene | 108 | 131 |

*flow rate of 2 liters per minute, not 3.5 liters per minute.

TABLE 2

| | Example No. | | | | | |
| --- | --- | --- | --- | --- | --- | --- |
| | 1 | 2 | 3 | 4 | 5 | 6 |
| Fibre Pulling Speed (m/min) | 20 | 30 | 30 | 50 | 240 | 240 |
| Reactor Tube Bore (mm) | 22 | 22 | 22 | 22 | 9.5 | 9.5 |
| Reactor Tube Length (mm) | 600 | 600 | 600 | 600 | 1000 | 1000 |
| Reactor Tube Set Temp. (°C.) | 800 | 400 | 150 | off | off | off |
| Drawing (Ar) | 4.6 | 2.85 | 3.0 | 2.0 | 2.0 | 18.0 |
| Furnace (He) Purge Rate (1/min) | | | | | 2.0 | 3.0 |
| Reagent Flow Rate (1/min) | 3.5 | 2.3 | 0.5 | 0.25 | 0.3 | 0.2 |
| Carbon Coating Depth (nm) | 108 | 65 | 65 | 65 | 30 | 30 |
| Reagent Consumption Per Meter of Fibre Coated (ml) | 175 | 77 | 10 | 5 | 1.25 | 0.83 |

TABLE 3

| Reagent | Reagent Flow Rate (ml/min) | Carbon Coating Depth (nm) |
| --- | --- | --- |
| Acetylene | 1530 | 33.8 |
| | 2250 | 52.9 |
| | 3000 | 76.2 |
| Propadiene | 450 | 41.9 |
| | 600 | 53.9 |
| | 750 | 72.4 |

I claim:
1. A method of providing a glass fibre with a vitreous carbon coating, which coating is formed principally by the pyrolysis of propadiene.
2. A method of providing a glass fibre with a vitreous carbon coating, which method is as claimed in claim 1, and wherein the pyrolysis takes place in a reactor tube maintained at a temperature insufficient to promote pyrolysis at a significant rate, and wherein pyrolysis is promoted by the heat of the fibre which is introduced into the reactor tube at a higher temperature.
3. A method as claimed in claim 2 wherein the vitreous carbon coating deposition is performed on-line with the production of the glass fibre by drawing from the heat-softened tip of a glass rod preform and wherein said higher temperature is provided by the retained heat of the fibre after its production from the preform.
4. A vitreous carbon coated optical fibre made by the method claimed in claim 1.
5. An optical fibre as claimed in claim 4 which fibre is provided with a plastics protective coating over the vitreous carbon coating.
6. A vitreous carbon coated optical fibre made by the method claimed in claim 2.
7. An optical fibre as claimed in claim 6 which fibre is provided with a plastics protective coating over the vitreous carbon coating.

* * * * *